United States Patent
Zhang et al.

(10) Patent No.: US 11,119,732 B2
(45) Date of Patent: Sep. 14, 2021

(54) MULTI-ADDEND ADDER CIRCUIT FOR STOCHASTIC COMPUTING

(71) Applicant: HUAWEI TECHNOLOGIES CO., LTD., Shenzhen (CN)

(72) Inventors: Jian Zhang, Shenzhen (CN); Yangyang Tang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/004,893

(22) Filed: Aug. 27, 2020

(65) Prior Publication Data

US 2020/0394018 A1 Dec. 17, 2020

Related U.S. Application Data

(63) Continuation of application No. PCT/CN2018/113353, filed on Nov. 1, 2018.

(30) Foreign Application Priority Data

Mar. 15, 2018 (CN) .......................... 201810211813.3

(51) Int. Cl.
*G06F 7/70* (2006.01)
*G06F 7/505* (2006.01)
(Continued)

(52) U.S. Cl.
CPC ................ *G06F 7/505* (2013.01); *G06F 7/02* (2013.01); *G06F 7/4981* (2013.01); *G06F 7/535* (2013.01); *G06F 7/70* (2013.01); *H03K 19/21* (2013.01)

(58) Field of Classification Search
CPC ...................................... G06F 7/60; G06F 7/70
See application file for complete search history.

(56) References Cited

U.S. PATENT DOCUMENTS 6,745,219 B1 * 6/2004 Zelkin .................... G06N 7/005
708/490
9,496,875 B1 11/2016 Schleicher et al.
(Continued)

FOREIGN PATENT DOCUMENTS

CN          105027076 A    11/2015
CN          105512724 A     4/2016
(Continued)

OTHER PUBLICATIONS

Vincent T. Lee et al. Energy-Efficient Hybrid Stochastic-Binary Neural Networks for Near-Sensor Computing, 2017 Design, Automation and Test in Europe (DATE), 2017 IEEE, pp. 13-18.

*Primary Examiner* — Chuong D Ngo
(74) *Attorney, Agent, or Firm* — Stein IP, LLC

(57) ABSTRACT

A multi-addend adder circuit used for multi-addend addition in a polar representation in stochastic computing. The multi-addend adder circuit includes a buffer circuit and a computing circuit, where the buffer circuit is configured to store to-be-buffered data for at least one cycle and output buffer data, and the computing circuit is configured to process a plurality of pieces of bitstream data and the buffer data and output one piece of bitstream data and the to-be-buffered data, where the piece of output bitstream data is a quotient of dividing a sum of summation data and the buffer data by a scale-down coefficient, the output to-be-buffered data is a remainder of dividing a sum of all summation data until a current cycle by the scale-down coefficient, and the summation data is a quantity of bits whose values are 1 in the plurality of pieces of first bitstream data.

20 Claims, 6 Drawing Sheets

(51) Int. Cl.
  *G06F 7/02*    (2006.01)
  *G06F 7/498*   (2006.01)
  *G06F 7/535*   (2006.01)
  *H03K 19/21*   (2006.01)

(56) References Cited

U.S. PATENT DOCUMENTS 10,891,536 B1 * 1/2021 Merkel .................. G06N 3/063
2017/0255225 A1 * 9/2017 Lilja .......................... G06F 7/70

FOREIGN PATENT DOCUMENTS

| CN | 105718240 A | 6/2016 |
| CN | 205959185 U | 2/2017 |

* cited by examiner

| m | $S_0$ | $S_1$ |
|---|---|---|
| 0 | 0 | 0 |
| 1 | 0 | $T_{out}$ |
| 2 | 0 | 1 |
| 3 | $T_{out}$ | 1 |
| 4 | 1 | 1 |

| m | $S_0$ | $S_1$ |
|---|---|---|
| 0 | 0 | 0 |
| 1 | 0 | $T_{out}$ |
| 2 | 0 | 1 |
| 3 | 1 | $T_{out}$ |
| 4 | 1 | 1 |

MULTI-ADDEND ADDER CIRCUIT FOR STOCHASTIC COMPUTING

CROSS-REFERENCE TO RELATED APPLICATION

This application is a continuation of International Application No. PCT/CN2018/113353, filed on Nov. 1, 2018, which claims priority to Chinese Patent Application No. 201810211813.3, filed on Mar. 15, 2018. The disclosures of the aforementioned applications are hereby incorporated by reference in their entireties.

TECHNICAL FIELD

Aspects of the present invention relate to the field of stochastic computing, and in particular, to a multi-addend adder circuit.

BACKGROUND

In stochastic computing, input data and output data are generally bitstreams in a polar representation. For example, in a unipolar representation, if a bitstream X of length N includes $N_1$ ones and $N_0$ ($N_0=N-N_1$) zeros, the bitstream X represents a number $P_x=N_1/N$. For example, in the unipolar representation, an 8-bit bitstream 0100 1001 represents a number 3/8. In common computing, for example, multi-addend addition, a bitstream in the polar representation may be implemented by a simple logic circuit.

FIG. 1 shows a multi-addend adder circuit 100 for stochastic computing, including a plurality of two-input adder circuits 110. The multi-addend adder circuit 100 receives a plurality of bitstreams $A_0$ to $A_{N-1}$ that represent numbers in stochastic computing, and generates one bitstream S, where $$S = \frac{1}{K}(A_0 + A_1 + \ldots + A_{N-2} + A_{N-1}).$$

The two-input adder circuit 110 is a two-input selector. Data input ends of the two-input adder circuit 110 receives two input bitstreams, and a signal selection end of the two-input adder circuit 110 receives a selection bitstream whose value is 0.5 in the polar representation, for example, a bitstream 0101 1100 in the unipolar representation. The two-input adder circuit 110 performs stochastic selection on the two input bitstreams with a probability of 50%, to implement a function of the two-input adder circuit. The multi-addend adder circuit 100 performs addition on the plurality of bitstreams $A_0$ to $A_{N-1}$ through the plurality of two-input adder circuits 110 in a tree structure. Each stage of two-input adder circuit 110 halves a quantity of input bitstreams, and finally the one bitstream S is obtained. Stochastic selection is performed on input bitstreams using a selection bitstream, to implement two-input addition. This may cause a relatively large computing error, and decrease computing precision of the multi-addend adder circuit 100.

SUMMARY

Embodiments of the present invention provide a multi-addend adder circuit for stochastic computing, to improve computing precision of the multi-addend adder circuit.

To more clearly describe the embodiments of the present invention, the following terms, abbreviations, or symbols are used.

m[i]: represents a value of an ith bit of data m in binary.

$\overline{m[i]}$: represents a value obtained by inverting the value of the ith bit of the data m in binary.

m[i:j]: represents values of the ith bit to a jth bit of the data m in binary. For example, when m is 0100 in binary, m[2:1] represents 10 in binary.

⊕: is an XOR operator, indicating that an XOR operation is performed on two pieces of data.

⌈x⌉: is a ceiling symbol, indicating that a value x is rounded up. For example, ⌈5.5⌉=6.

⌊x⌋: is a floor symbol, indicating that a value x is rounded down. For example, ⌊5.5⌋=5.

According to a first aspect, an embodiment of the present invention provides a multi-addend adder circuit for stochastic computing, including a buffer circuit and a computing circuit, where the buffer circuit is configured to: store buffer input data for at least one cycle, and input the buffer input data as buffer output data to the computing circuit; and the computing circuit is configured to: perform computing on a plurality of pieces of first bitstream data and the buffer output data, and output second bitstream data and the buffer input data, where the buffer input data is a remainder of dividing a sum of summation data in all cycles until a current cycle by a scale-down coefficient, the summation data is a quantity of pieces of first bitstream data whose values are 1 in the plurality of pieces of first bitstream data in each cycle, the second bitstream data is a quotient of dividing a sum of the summation data in each cycle and the buffer output data in each cycle by the scale-down coefficient, the first bitstream data and the second bitstream data are data in a polar representation, the scale-down coefficient is a preset parameter, and the cycle is a cycle in which the plurality of pieces of first bitstream data are input.

The buffer circuit stores the buffer input data generated by the computing circuit in each cycle, and the buffer input data is used for computing in a next cycle. In other words, computing performed by the multi-addend adder circuit in the current cycle is actually computing performed on buffer input data generated after computing in a previous cycle and a plurality of pieces of input first bitstream data. Therefore, a computing error is reduced, and computing precision of the multi-addend adder circuit is improved.

In a possible implementation, the first bitstream data is denoted as $A_i(j)$, where a value of i ranges from 0 to N-1, a value of j ranges from 0 to x, and $A_i(j)$ represents an $i^{th}$ piece of bitstream data in a $j^{th}$ cycle. Then, in the $j^{th}$ cycle, summation data may be denoted as $m(j)=\Sigma_{i=0}^{N-1} A_i(j)$, buffer input data may be denoted as $R_{in}(j)$, where $R_{in}(j)=[\Sigma_{j=0}^{x}m(j)]$ mod $K=[\Sigma_{j=0}^{x}\Sigma_{i=0}^{N-1}A_i(j)]$ mod K, and second bitstream data may be denoted as $S(j)=[m(j)+R_{in}(j)]/K$, where K represents the scale-down coefficient, and mod represents a modulo operation.

In a possible implementation, the computing circuit includes a summation circuit, the summation circuit is configured to receive the plurality of pieces of first bitstream data and generate first intermediate data, and the first intermediate data is the summation data.

In a possible implementation, the computing circuit further includes an adder circuit, the adder circuit is configured to receive the first intermediate data and the buffer output data and generate second intermediate data, and the second intermediate data is a sum of the first intermediate data and the buffer output data.

In a possible implementation, the computing circuit further includes a comparator circuit, and the comparator circuit is configured to: receive the second intermediate data, compare the second intermediate data and the scale-down coefficient, and generate the second bitstream data, where when the second intermediate data is greater than or equal to the scale-down coefficient, the second bitstream data is 1; otherwise, the second bitstream data is 0.

In a possible implementation, the computing circuit further includes a subtractor circuit, and the subtractor circuit is configured to receive the second intermediate data and the second bitstream data and generate the buffer input data, where when the second bitstream data is 1, the buffer input data is a difference between the second intermediate data and the scale-down coefficient; and when the second bitstream data is 0, the buffer input data is equal to the second intermediate data.

In a possible implementation, a quantity of bits of a capacity of the buffer circuit is at least a logarithm of the scale-down coefficient to base 2.

In a possible implementation, the buffer circuit is a register.

In a possible implementation, the summation circuit is a parallel counter.

In a possible implementation, when the scale-down coefficient is 2 to the power of an integer, the second bitstream data generated by the comparator circuit is a most significant bit of the second intermediate data, where the second intermediate data is binary data. In this case, a structure of the comparator circuit is simplified.

In a possible implementation, when the scale-down coefficient is 2 to the power of an integer, buffer data that is in the current cycle and that is generated by the subtractor circuit is a second most significant bit to a least significant bit of the second intermediate data, where the second intermediate data is binary data. In this case, a structure of the subtractor circuit is simplified.

According to a second aspect, an embodiment of the present invention provides a multi-addend adder circuit for stochastic computing, including a summation circuit, an adder circuit, a comparator circuit, a subtractor circuit, and one or more buffer circuits, where the summation circuit is configured to: receive a plurality of pieces of first bitstream data, calculate a quantity of pieces of first bitstream data whose values are 1 in the plurality of pieces of first bitstream data in each cycle, and generate first intermediate data; the adder circuit adds the first intermediate data and third intermediate data and generates second intermediate data, where the third intermediate data is an output of the subtractor circuit; the comparator circuit receives the second intermediate data and generates second bitstream data, where when the second intermediate data is greater than or equal to a scale-down coefficient, the second bitstream data is 1; otherwise, the second bitstream data is 0; and the plurality of pieces of first bitstream data and the second bitstream data are data in a polar representation, and the scale-down coefficient is a preset parameter; the subtractor circuit receives the second intermediate data and the second bitstream and generates the third intermediate data, where when the second bitstream data is 1, the third intermediate data is a difference between the second intermediate data and the scale-down coefficient; and when the second bitstream data is 0, the third intermediate data is the second intermediate data; and the one or more buffer circuits are configured to store at least one piece of buffer data for at least one cycle and output the at least one piece of buffer data, where the buffer data includes data received and generated by the adder circuit, the comparator circuit, and the subtractor circuit, and data generated by the adder circuit, the comparator circuit, and the subtractor circuit during computing; and the cycle is a cycle in which the plurality of pieces of first bitstream data are input.

The buffer circuit stores the buffer data in each cycle, and the buffer data is used for computing in a next cycle. In other words, computing performed by the multi-addend adder circuit in a current cycle actually includes computing performed on buffer data stored by the buffer circuit in a previous cycle. Therefore, a computing error is reduced, and computing precision of the multi-addend adder circuit is improved.

In a possible implementation, the one or more buffer circuits store the second intermediate data generated by the adder circuit for the at least one cycle, and output the second intermediate data to the subtractor circuit and the comparator circuit.

In a possible implementation, the buffer circuit is a register.

In a possible implementation, the summation circuit is a parallel counter.

In a possible implementation, when the scale-down coefficient is 2 to the power of an integer, the second bitstream data generated by the comparator circuit is a most significant bit of the second intermediate data, where the second intermediate data is binary data. In this case, a structure of the comparator circuit is simplified.

In a possible implementation, when the scale-down coefficient is 2 to the power of the integer, buffer data that is in the current cycle and that is generated by the subtractor circuit is a second most significant bit to a least significant bit of the second intermediate data, where the second intermediate data is binary data. In this case, a structure of the subtractor circuit is simplified.

According to a third aspect, an embodiment of the present invention provides a multi-addend adder circuit for stochastic computing, including a buffer circuit and a computing circuit, where the buffer circuit is configured to store buffer input data for one cycle and generate buffer output data, where when the buffer input data is 0, a value of the buffer output data remains unchanged; and when the buffer input data is 1, a value of the buffer output data is flipped; and the computing circuit is configured to: perform computing on a plurality of pieces of first bitstream data and the buffer output data, and output a plurality of pieces of second bitstream data and the buffer input data; where the buffer input data is a value obtained by performing an XOR operation on the plurality of pieces of first bitstream data, a quantity of the plurality of pieces of second bitstream data is a value obtained by rounding up a result of dividing a quantity of the plurality of pieces of first bitstream data by 2, and the plurality of pieces of second bitstream data include $W_1$ pieces of bitstream data whose values are 1, $W_t$ pieces of bitstream data whose values are the buffer output data, and $W_0$ pieces of bitstream data whose values are 0; where $W_1$ is a value obtained by rounding down a result of dividing summation data by 2, in other words, $W_1$ is [m/2]; $W_t$ is a remainder of dividing the summation data by 2, in other words, $W_t$ is m mod 2; and $W_0$ is a difference between the quantity of the plurality of pieces of second bitstream data and a sum of $W_1$ and $W_t$, in other words, $W_0$ is $[N/2]-W_1-W_t$; and the plurality of pieces of first bitstream data and the plurality of pieces of second bitstream data are data in a polar representation, and the cycle is a cycle in which the plurality of pieces of first bitstream data are input.

The buffer circuit stores the buffer input data generated by the computing circuit in each cycle, and the buffer input data is used for computing in a next cycle. In other words, computing performed by the multi-addend adder circuit in a current cycle is actually computing performed on buffer input data generated after computing in a previous cycle and a plurality of pieces of input first bitstream data. Therefore, a computing error is reduced, and computing precision of the multi-addend adder circuit is improved.

In a possible implementation, the buffer circuit is a flip-flop.

In a possible implementation, the computing circuit includes a summation circuit and an output logic circuit, where the summation circuit is configured to: receive the plurality of pieces of first bitstream data in a current cycle, calculate the summation data, and generate first intermediate data and second intermediate data, where the first intermediate data is a least significant bit of the summation data, the second intermediate data is a most significant bit to a second least significant bit of the summation data, the summation data is binary data; and the output logic circuit is configured to: receive the first intermediate data, the second intermediate data, and first buffer data, and generate the second bitstream data.

In a possible implementation, the summation circuit is a parallel counter.

BRIEF DESCRIPTION OF DRAWINGS

To describe the technical solutions in the embodiments of the present invention or in the prior art more clearly, the following briefly describes the accompanying drawings for describing the embodiments or the prior art.

DESCRIPTION OF EMBODIMENTS

In stochastic computing, computing is performed on a bitstream in a polar representation. In different polar representations, a same bitstream may represent different numbers. For example, in a unipolar representation, if a bitstream X of length N includes $N_1$ ones and $N_0$ ($N_0=N-N_1$) zeros, the bitstream X represents a number $P_x=N_1/N$. For example, in the unipolar representation, an 8-bit bitstream 0100 1001 represents a number 3/8. In a bipolar representation, if a bitstream X of length N includes $N_1$ ones and $N_0$ ($N_0=N-N_1$) zeros, the bitstream X represents a number $P_x=(N_1-N_0)/N$. For example, in the bipolar representation, an 8-bit bitstream 0100 1001 represents a number −1/8. For ease of understanding, bitstreams in all the embodiments of the present invention are represented in the unipolar representation. However, it should be noted that the bitstreams in all the embodiments of the present invention may alternatively be represented in the bipolar representation or another polar representation.

Figure 1:
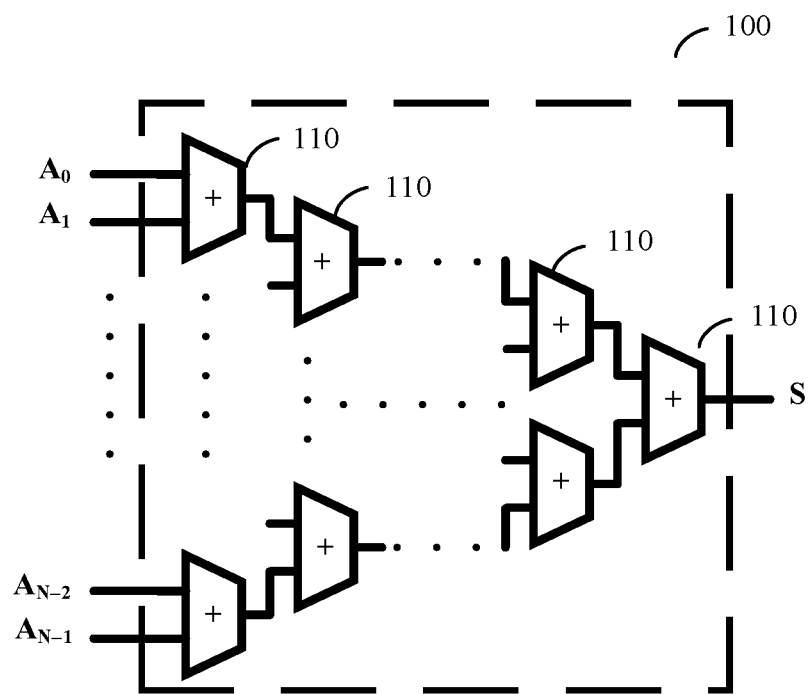
FIG. 1 is a schematic diagram of a multi-addend adder circuit in the prior art.
Figure 2:
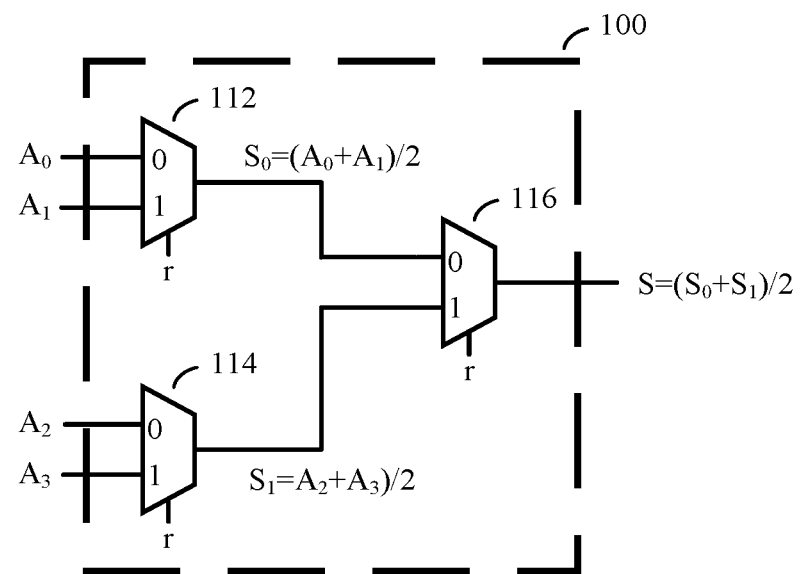
FIG. 2 is a schematic diagram of a specific multi-addend adder circuit in the prior art.

FIG. 2 shows a specific example of a multi-addend adder circuit 100 in the prior art. The multi-addend adder circuit 100 performs multi-addend addition on a plurality of pieces of input first bitstream data $A_0$ to $A_3$, to obtain second bitstream data S, where $S=\frac{1}{4}(A_0+A_1+A_2+A_3)$. The multi-addend adder circuit 100 includes a two-input selector 112, a two-input selector 114, and a two-input selector 116. The two-input selector 112 calculates a sum of bitstreams $A_0$ and $A_1$, and scales down the sum of the bitstreams $A_0$ and $A_1$. The two-input selector 112 outputs $S_0$, and $S_0=\frac{1}{2}(A_0+A_1)$. The two-input selector 114 calculates a sum of bitstreams $A_2$ and $A_3$, and scales down the sum of the bitstreams $A_2$ and $A_3$. The two-input selector 114 outputs $S_1$, and $S_1=\frac{1}{2}(A_2+A_3)$. The two-input selector 116 calculates a sum of $S_0$ and $S_1$, and scales down the sum of $S_0$ and $S_1$, to obtain the second bitstream S.

A specific example is used to describe an operating procedure of the multi-addend adder circuit 100. A bitstream $A_0$ is 01 00 (1/4), a bitstream $A_1$ is 01 00 (1/4), a bitstream $A_2$ is 00 10 (1/4), and a bitstream $A_3$ is 00 11 (2/4). Selection signals r each are 00 11 (2/4). A least significant bit of each bitstream is first input to the multi-addend adder circuit 200. In a first cycle, input values of the bitstreams $A_0$ to $A_3$ are 0, 0, 0, and 1, and selection signals r are 1. Then, $S_0=0$, $S_1=1$, and S=1. In a second cycle, values of $A_0$ to $A_3$ are 0, 0, 1, and 1, and selection signals r are 1. Then, $S_0=0$, $S_1=1$, and S=1. In a third cycle, values of $A_0$ to $A_3$ are 1, 1, 0, and 0, and selection signals r are 0. Then, $S_0=1$, $S_1=0$, and S=1. In a fourth cycle, values of $A_0$ to $A_3$ are 0, 0, 0, and 0, and selection signals r are 0. Then, $S_0=0$, $S_1=0$, and S=0. Therefore, second bitstream data S output by the multi-addend adder circuit 100 is 01 11. An actual computing result S is 3/4, but a theoretical computing result S' is $\frac{1}{4}(\frac{1}{4}+\frac{1}{4}+\frac{1}{4}+\frac{1}{2})=\frac{5}{16}$. A difference between the actual computing result and the theoretical computing result is 7/16. Stochastic selection is performed on two input bitstreams with a probability of 50% using a selection signal r, but the selection signal r and the two input bitstreams cannot be independent of each other. Consequently, computing precision of the multi-addend adder circuit 100 is relatively low.

Figure 3:
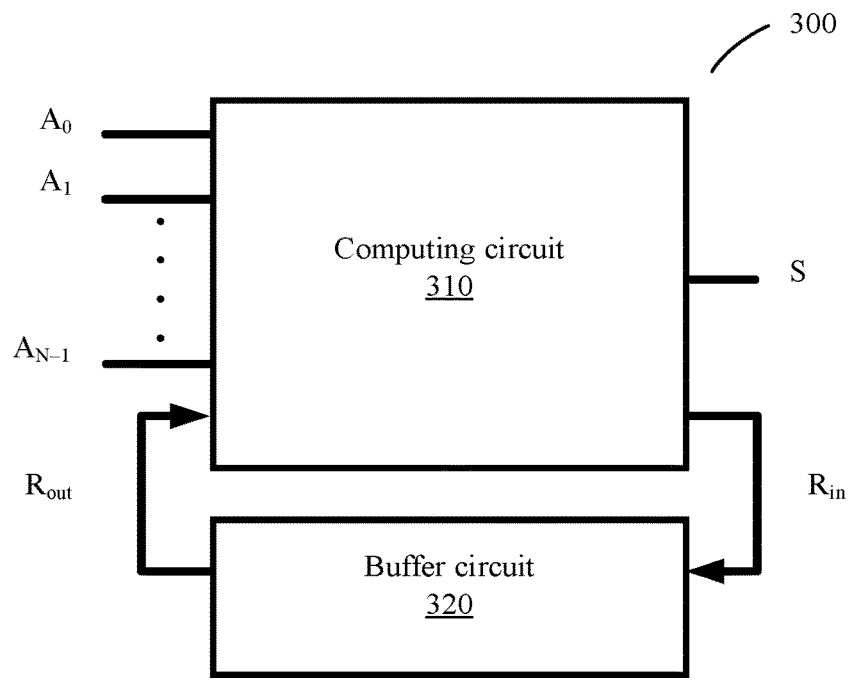
FIG. 3 is a schematic diagram of a multi-addend adder circuit according to an embodiment of the present invention.

Therefore, an embodiment of the present invention provides a multi-addend adder circuit 300 shown in FIG. 3, to implement multi-addend addition in stochastic computing. Inputs of the multi-addend adder circuit 300 are a plurality of pieces of first bitstream data $A_0$ to $A_{N-1}$ that represent numbers in stochastic computing, and an output of the multi-addend adder circuit 300 is second bitstream data S. The pieces of first bitstream data $A_0$ to $A_{N-1}$ and the second bitstream data S each may be represented in a unipolar representation.

The multi-addend adder circuit 300 includes a computing circuit 310 and a buffer circuit 320. The buffer circuit 320 is configured to store buffer input data $R_{in}$ for at least one cycle, and input the buffer input data $R_{in}$ as buffer output data $R_{out}$ to the computing circuit 310. Inputs of the computing circuit 310 are the pieces of first bitstream data $A_0$ to $A_{N-1}$ and the buffer output data $R_{out}$ that is generated by the buffer circuit 320. The computing circuit 310 calculates a sum of the buffer output data $R_{out}$ and the plurality of pieces of input first bitstream data $A_0$ to $A_{N-1}$, scales down the sum of the buffer output data $R_{out}$ and the plurality of pieces of input first bitstream data $A_0$ to $A_{N-1}$, and generates one piece of second bitstream data S and the buffer input data $R_{in}$. The second bitstream data S is bitstream data obtained after scaling down, that is, $$S = \frac{1}{K}(A_0 + A_1 + \ldots + A_{N-2} + A_{N-1}),$$

where K is a preset scale-down coefficient for preventing an output from exceeding a range of numbers that can be represented by bitstreams in the unipolar representation. A quantity of pieces of first bitstream data whose values are 1 in the pieces of first bitstream data $A_0$ to $A_{N-1}$ in each cycle is used as summation data m in the cycle. For example, values of $A_0$ to $A_3$ are 0, 1, 1, and 0, and summation data m is 2. In one cycle, a value of the second bitstream data S is a quotient of dividing a sum of summation data m in the current cycle and buffer output data $R_{out}$ in the current cycle by the scale-down coefficient K, and buffer input data $R_{in}$ is a remainder of dividing a sum of summation data m in all cycles until the current cycle by K. A quantity of bits of the summation data m is related to the scale-down coefficient K. In one embodiment, the quantity of bits of the summation data m is $\lceil \log_2 K \rceil + 1$. The cycle in this embodiment of the present invention is a cycle in which the plurality of pieces of first bitstream data $A_0$ to $A_{N-1}$ are input. For example, if 1-bit data of each bitstream is input every 2 ns, a cycle is 2 ns.

In one embodiment, a current cycle is an $x^{th}$ cycle. Any piece of bitstream data in N pieces of input first bitstream data may be denoted as $A_i(j)$, where a value of i ranges from 0 to N−1, and a value of j ranges from 0 to x. $A_i(j)$ represents an $i^{th}$ piece of bitstream data in a $j^{th}$ cycle, and a value of $A_i(j)$ may be 0 or 1. Then, in the $j^{th}$ cycle, summation data may be denoted as $m(j)=\Sigma_{i=0}^{N-1}A_i(j)$, and buffer input data may be denoted as $R_{in}(j)=[\Sigma_{j=0}^{x}m(j)]$ mod K, that is, $R_{in}(j)=[\Sigma_{j=0}^{x}\Sigma_{i=0}^{N-1}A_i(j)]$ mod K, where K represents the scale-down coefficient, and mod represents a modulo operation. For example, A mod B represents a remainder of dividing A by B. Second bitstream data may be denoted as $S(j)=[m(j)\pm R_{in}(j)]/K$.

The buffer circuit 320 stores the buffer input data $R_{in}$ generated by the computing circuit 310 in each cycle, and the buffer input data $R_{in}$ is used for computing in a next cycle. In other words, computing performed by the multi-addend adder circuit 300 in the current cycle is actually computing performed on buffer input data $R_{in}$ generated after computing in a previous cycle and a plurality of pieces of input first bitstream data $A_0$ to $A_{N-1}$, but not computing performed on only the plurality of pieces of first bitstream data $A_0$ to $A_{N-1}$ in the current cycle. Therefore, a computing error is reduced, and computing precision of the multi-addend adder circuit 300 is improved.

A minimum capacity of the buffer circuit 320 is $\lceil \log_2 K \rceil$ bits, to store the buffer input data $R_{in}$. The buffer circuit 320 may be a general-purpose register or another circuit having a storage function, for example, a random access memory (RAM).

A specific example is used to describe an operating procedure of the multi-addend adder circuit 300. For example, the scale-down coefficient K=4, the buffer input data $R_{in}$ stored in the buffer circuit 320 is 0, and the inputs are four pieces of bitstream data $A_0$ to $A_3$. The bitstream $A_0$ is 01 00 (1/4), the bitstream $A_1$ is 01 00 (1/4), the bitstream $A_2$ is 00 10(1/4), and the bitstream $A_3$ is 00 11(2/4). A least significant bit of each bitstream is first input to the computing circuit 310. In a first cycle, input values of the bitstreams $A_0$ to $A_3$ are 0, 0, 0, and 1. Then, S is a quotient of (0+0+0+1+0)/4, that is, S=0. Rio is a remainder of (0+0+0+1+0)/4, that is, $R_{in}$=1. In a second cycle, $R_{out}$=1, and values of $A_0$ to $A_3$ are 0, 0, 1, and 1. Then, S is a quotient of (0+0+1+1+1)/4, that is, S=0. $R_{in}$=3. In a third cycle, $R_{out}$=3, and values of $A_0$ to $A_3$ are 1, 1, 0, and 0. Then, S is a quotient of (1+1+0+0+3)/4, that is, S=1. $R_{in}$=1. In a fourth cycle, $R_{out}$=1, and values of $A_0$ to $A_3$ are 0, 0, 0, and 0. Then, S is a quotient of (0+0+0+0+1)/4, that is, S=0. $R_{in}$=1. The second bitstream data S output by the computing circuit 310 is 01 00, that is, S=1/4. A theoretical computing result S' is equal to 1/4(1/4+1/4+1/4+1/2)=5/16. A difference between S and S' is 1/16. Therefore, computing precision of the multi-addend adder circuit 300 is improved.

Figure 4:
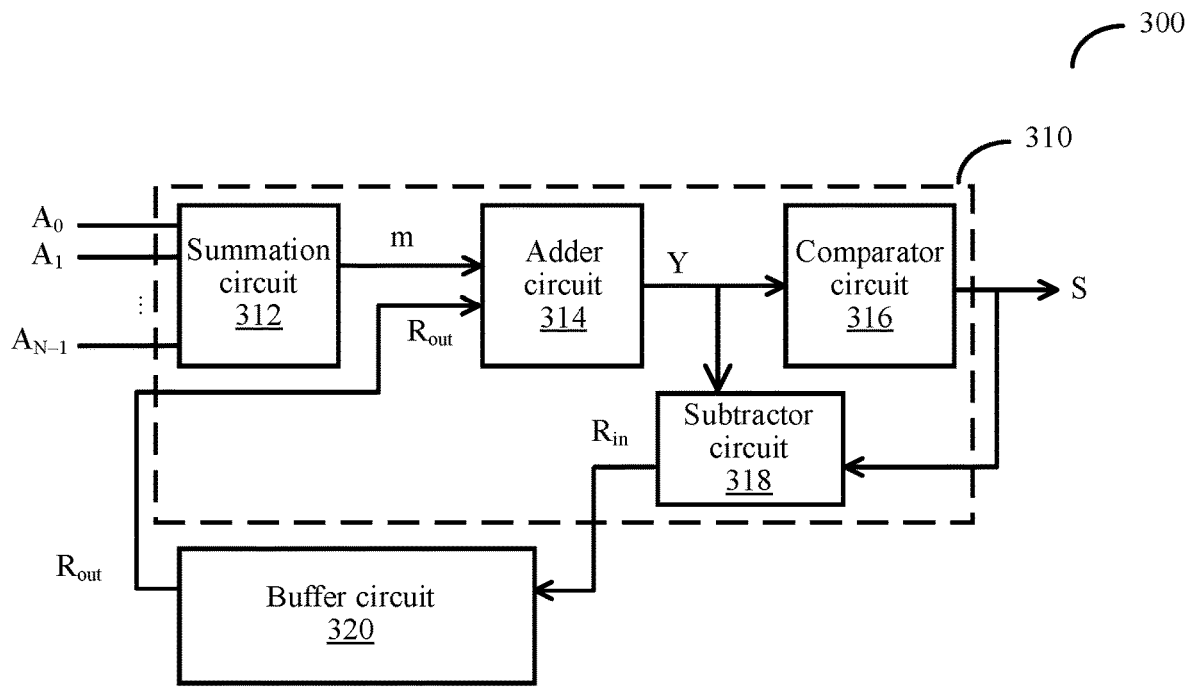
FIG. 4 is a schematic diagram of a specific multi-addend adder circuit according to an embodiment of the present invention.

FIG. 4 shows a specific implementation of the multi-addend adder circuit 300. A computing circuit 310 includes a summation circuit 312, an adder circuit 314, a comparator circuit 316, and a subtractor circuit 318. The summation circuit 312 receives a plurality of pieces of input first bitstream data $A_0$ to $A_{N-1}$, calculates summation data m in a current cycle, and outputs the summation data m to the adder circuit 314. The summation data m is a quantity of pieces of first bitstream data whose values are 1 in the plurality of pieces of first bitstream data $A_0$ to $A_{N-1}$. For example, if the pieces of first bitstream data $A_0$ to $A_3$ are 0, 1, 1, and 0, the summation data m is 2. The adder circuit 314 adds the summation data m output by the summation circuit 312 and buffer data $R_{out}$ output by a buffer circuit 320, and outputs a computing result Y. The comparator circuit 316 compares the computing result Y output by the adder circuit 314 with a preset scale-down coefficient K. When Y≥K, the comparator circuit 316 outputs a computing result S=1; otherwise, the comparator circuit 316 outputs a computing result S=0. Inputs of the subtractor circuit 318 are the computing result Y output by the adder circuit 314 and the computing result S output by the comparator circuit 316. When S=1, the subtractor circuit 318 outputs buffer data $R_{in}$, and $R_{in}$=Y−K; when S=0, the subtractor circuit 318 outputs buffer data $R_{in}$, and $R_{in}$=Y.

The summation circuit 312 may be a parallel counter to complete computing of the summation data m in the current cycle. The parallel counter may be implemented by a lookup table (LUT) or another combinational logic circuit. When the scale-down coefficient K is 2 to the power of an integer, the comparator circuit 316 and the subtractor circuit 318 may be implemented by simpler circuits. For example, when the scale-down coefficient K is 32, the output S of the comparator circuit 650 is a most significant bit, namely, a $6^{th}$ bit, of the input Y of the comparator circuit 316, and the output $R_{in}$ of the subtractor circuit 318 is a second most significant bit to a least significant bit, namely, a $5^{th}$ bit to a $1^{st}$ bit, of the input Y of the subtractor circuit 318.

Figure 5:
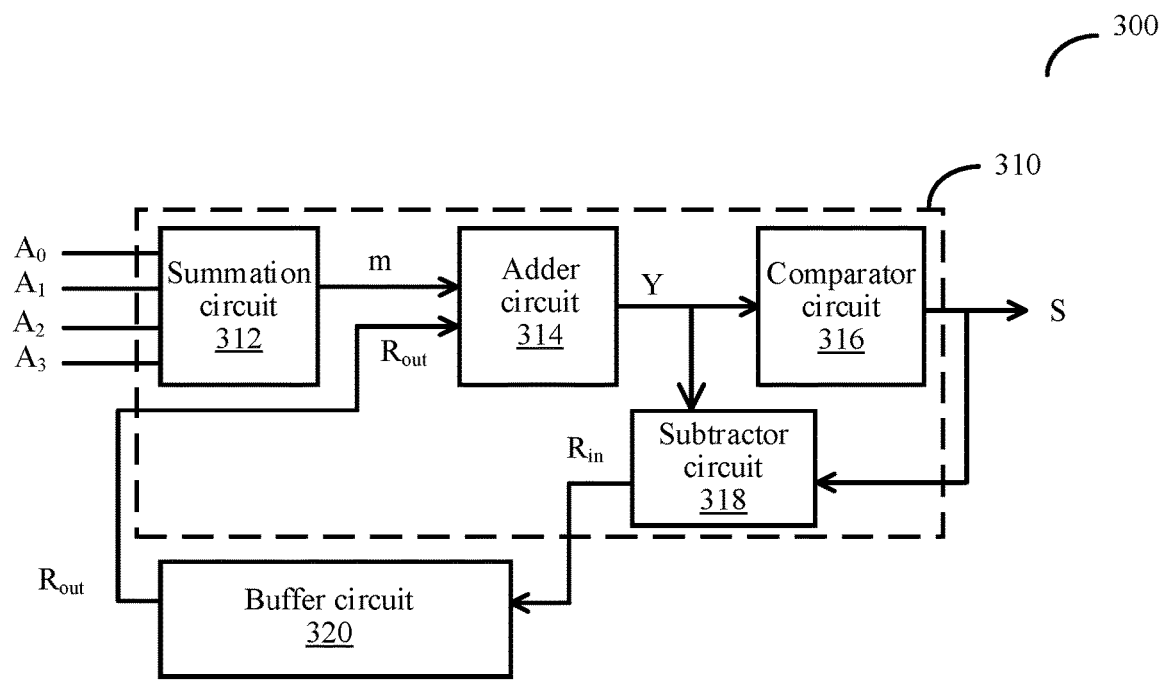
FIG. 5 is a schematic diagram of a more specific multi-addend adder circuit according to an embodiment of the present invention.

FIG. 5 shows a more specific implementation of the multi-addend adder circuit 300 for implementing addition of four bitstreams $A_0$ to $A_3$, that is, S=1/4($A_0$+$A_1$+$A_2$+$A_3$) in stochastic computing. A specific example is used to describe an operating procedure of the multi-addend adder circuit 300. The bitstream $A_0$ is 01 00 (1/4), the bitstream $A_1$ is 01 00 (1/4), the bitstream $A_2$ is 00 10 (1/4), and the bitstream $A_3$ is 00 11 (2/4). A least significant bit of each bitstream is first input to a computing circuit 310. Data in a buffer circuit 320 is 0. In a first cycle, input values of the bitstreams $A_0$ to $A_3$ are 0, 0, 0, and 1. Then, m=1, and $R_{out}$=0. Y=1, S=0, and $R_{in}$=1. In a second cycle, values of $A_0$ to $A_3$ are 0, 0, 1, and 1. Then, m=2, and $R_{out}$=1. Y=3, S=0, and $R_{out}$=3. In a third cycle, values of $A_0$ to $A_3$ are 1, 1, 0, and 0. Then, m=2, and $R_{out}$=3. Y=5, S=1, and $R_{in}$=1. In a fourth cycle, values of $A_0$ to $A_3$ are 0, 0, 0, and 0. Then, m=0, and $R_{out}$=1. Y=1, S=0, and $R_{out}$=1. Second bitstream data S output by the computing circuit 310 is 01 00, that is, S=¼. A theoretical computing result S' is ¼(¼+¼+¼+½)=5/16. A difference between S and S' is 1/16. Therefore, computing precision of the multi-addend adder circuit 300 is improved.

In the multi-addend adder circuit 300 shown in FIG. 5, a summation circuit 312 may be a parallel counter or other combinational logic to implement computing of a quantity of ones input to the summation circuit 312. In one embodiment, bits of the summation data m output by the summation circuit 312 may be provided by the following logical expressions. A $0^{th}$ bit of m: $m[0]=A_0 \oplus A_i \oplus A_2 \oplus A_3$, a $2^{nd}$ bit of m: $m[2]=A_0 \cdot A_1 \cdot A_2 \cdot A_3$, and a $1^{st}$ bit of m: $m[1]=\overline{m[2]} \cdot (A_0 \cdot A_1 + A_0 \cdot A_2 + A_0 \cdot A_3 + A_1 \cdot A_2 + A_1 \cdot A_3 + A_2 \cdot A_3)$, where m[i] is used to represent a value of an $i^{th}$ bit of m in binary, and $\oplus$ is an XOR operator. The foregoing logical expressions may be implemented by combinational logic or a lookup table. Because a scale-down coefficient K=4 is 2 to the power of an integer, a comparator circuit 316 and a subtractor circuit 318 that are in the multi-addend adder circuit 300 may be implemented by a simple circuit. For example, the comparator circuit 316 may directly select a most significant bit Y[2] output by the adder circuit 314 as an output result S, and the subtractor circuit 318 directly selects two least significant bits Y[1:0] output by the adder circuit 314 as an output result R n.

In another implementation, a multi-addend adder circuit 600 includes a summation circuit 312, an adder circuit 314, a comparator circuit 316, a subtractor circuit 318, and one or more buffer circuits 320. The summation circuit 312 receives a plurality of pieces of input first bitstream data $A_0$ to $A_{N-1}$, calculates summation data m, and outputs the summation data m to the adder circuit 314. The adder circuit 314 adds the summation data m output by the summation circuit 312 and a computing result D generated by the subtractor circuit 318, and outputs a computing result Y. The comparator circuit 316 compares the computing result Y output by the adder circuit 314 with a preset scale-down coefficient K. When Y≥K, the comparator circuit 316 outputs a computing result S=1; otherwise, the comparator circuit 316 outputs a computing result S=0. Inputs of the subtractor circuit 318 are the computing result Y output by the adder circuit 314 and the computing result S output by the comparator circuit 316. When S=1, the subtractor circuit 318 outputs a computing result D, and D=Y−K; when S=0, the subtractor circuit 318 outputs a computing result D, and D=Y. The one or more buffer circuits in the multi-addend adder circuit 600 are configured to store at least one piece of buffer data for at least one cycle and output the at least one piece of buffer data. The buffer data includes data generated by the adder circuit 314, the comparator circuit 316, and the subtractor circuit 318 during computing. The cycle is a cycle in which the plurality of pieces of first bitstream data $A_0$ to $A_{N-1}$ are input. For example, the buffer data may be the computing result Y output by the adder circuit 314. In this case, the buffer circuit 320 receives the computing result Y as an input, buffers the computing result Y for one or more cycles, and outputs the computing result Y to the comparator circuit 316 and the subtractor circuit 318. The buffer data may alternatively be data generated by the adder circuit 314, the comparator circuit 316, and the subtractor circuit 318 during computing.

Figure 6:
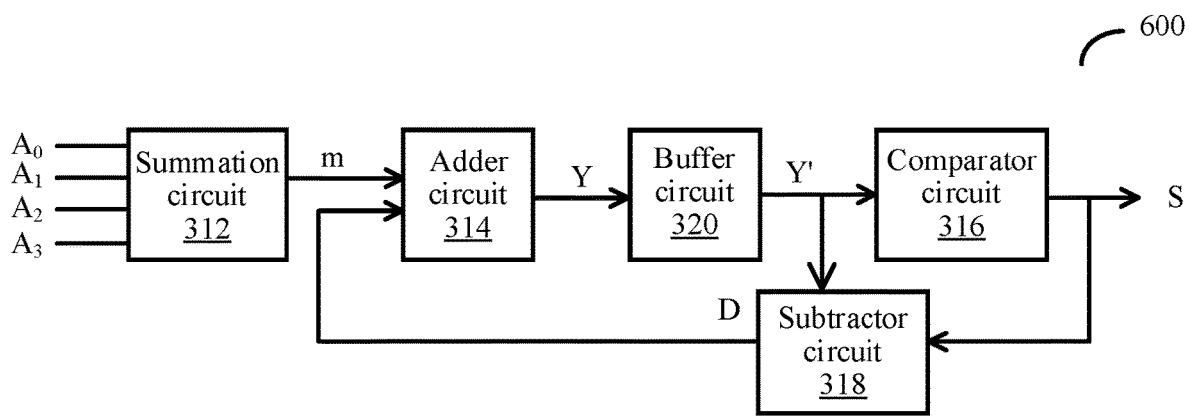
FIG. 6 is a schematic diagram of another multi-addend adder circuit according to an embodiment of the present invention.

FIG. 6 shows a specific implementation of the multi-addend adder circuit 600 provided in this embodiment of the present invention, to implement addition of four bitstreams $A_0$ to $A_3$, that is, S=¼($A_0$+$A_1$+$A_2$+$A_3$) in stochastic computing. The buffer circuit 320 receives the computing result Y output by the adder circuit 314, buffers the computing result Y for one cycle, and outputs Y' to the comparator circuit 316 and the subtractor circuit 318.

A specific example is used to describe an operating procedure of the multi-addend adder circuit 600. The bitstream $A_0$ is 01 00 (1/4), the bitstream $A_1$ is 01 00 (1/4), the bitstream $A_2$ is 00 10 (1/4), and the bitstream $A_3$ is 00 11 (2/4). A least significant bit of each bitstream is first input to a computing circuit 310. Data in the buffer circuit 320 is 0. In a first cycle, input values of the bitstreams $A_0$ to $A_3$ are 0, 0, 0, and 1. Then, Y'=0, S=0, D=0, m=1, and Y=1. In a second cycle, values of $A_0$ to $A_3$ are 0, 0, 1, and 1. Then, Y'=1, S=0, D=1, m=2, and Y=3. In a third cycle, values of $A_0$ to $A_3$ are 1, 1, 0, and 0. Then, Y'=3, S=0, D=3, m=2, and Y=5. In a fourth cycle, values of $A_0$ to $A_3$ are 0, 0, 0, and 0. Then, Y'=5, S=1, D=1, m=0, and Y=1. In a fifth cycle, Y'=1, S=0, and D=1. In the second cycle to the fifth cycle, second bitstream data S output by the multi-addend adder circuit 600 is 01 00, that is, S=¼. A theoretical computing result S' is ¼(¼+¼+¼+½)=5/16. A difference between S and S' is 1/16. Therefore, computing precision of the multi-addend adder circuit 300 is improved.

Figure 7:
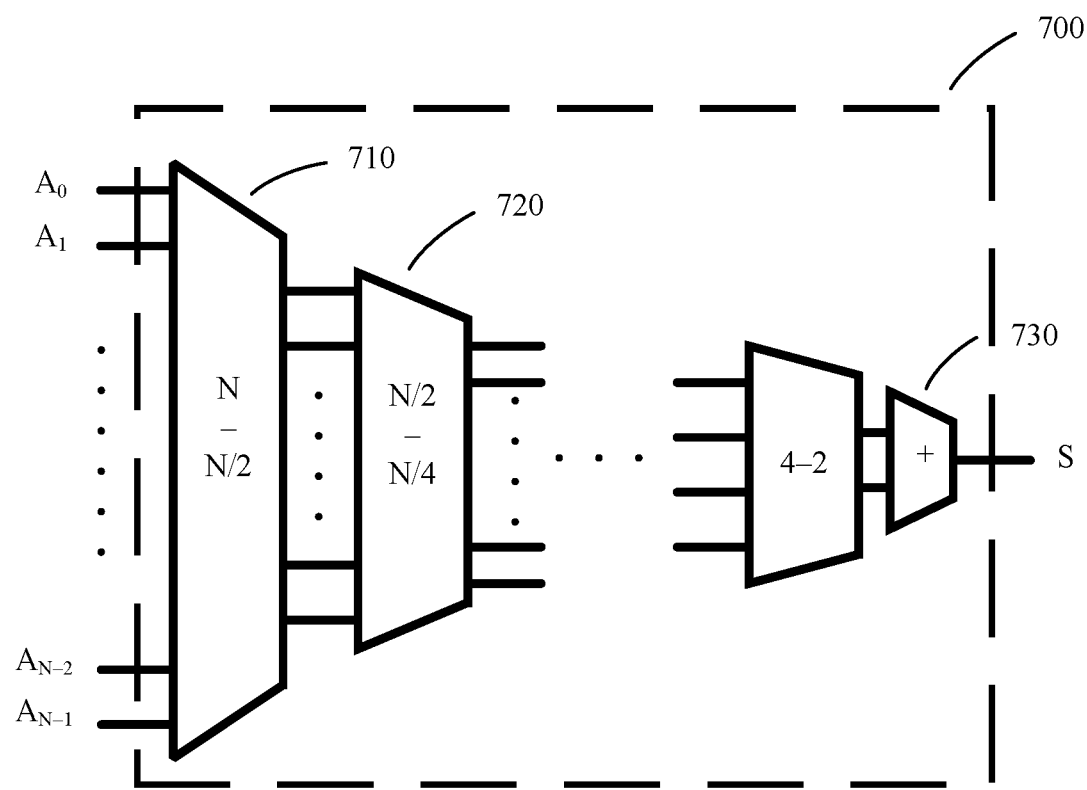
FIG. 7 is a schematic diagram of a multi-stage circuit according to an embodiment of the present invention.

Multi-addend addition of in stochastic computing may also be implemented by a multi-stage circuit 700 shown in FIG. 7. Inputs of the multi-stage circuit 700 are a plurality of bitstreams $A_0$ to $A_{N-1}$ that represent numbers in stochastic computing. An output of the multi-stage circuit 700 is second bitstream data S that represents a number in stochastic computing, and $$S = \frac{1}{K}(A_0 + A_1 + \ldots + A_{N-2} + A_{N-1}),$$

where K is a preset scale-down coefficient for preventing an output result from exceeding a range of numbers that can be represented by bitstreams. The multi-stage circuit 700 includes a plurality of multi-addend adder circuits 710, 720, 730, and the like. Each stage of a multi-addend adder circuit halves input addends. The multi-addend adder circuit 710 performs addition on N pieces of input first bitstream data $A_0$ to $A_{N-1}$, and obtains N/2 pieces of bitstream data. The multi-addend adder circuit 720 performs addition on the N/2 pieces of bitstream data, and obtains N/4 bitstreams. Finally, second bitstream data S is obtained through a two-input adder circuit 730.

Figure 8:
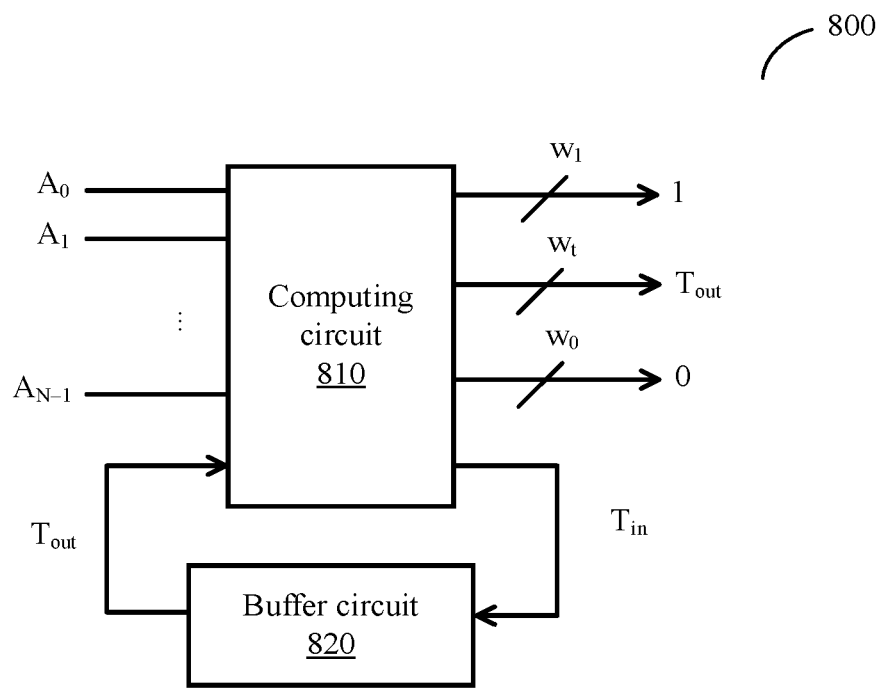
FIG. 8 is a schematic diagram of still another multi-addend adder circuit according to an embodiment of the present invention.

A multi-addend adder circuit 800 shown in FIG. 8 is a specific implementation of the multi-addend adder circuit 710, to implement addition of a plurality of pieces of input first bitstream data in stochastic computing and halving of a quantity of bitstreams. Inputs of the multi-addend adder circuit 800 are a plurality of pieces of first bitstream data $A_0$ to $A_{N-1}$ that represent numbers in stochastic computing. The multi-addend adder circuit 800 calculates a sum of the plurality of pieces of input first bitstream data $A_0$ to $A_{N-1}$, scales down a quantity of pieces of second bitstream data, and outputs a plurality of pieces of second bitstream data. A quantity of the pieces of second bitstream data is $\lceil N/2 \rceil$, that is, a value obtained by rounding up a result of dividing a quantity of the pieces of first bitstream data by 2. The multi-addend adder circuit 800 includes a computing circuit 810 and a buffer circuit 820. The computing circuit 810 receives the pieces of first bitstream data $A_0$ to $A_{N-1}$ and buffer output data $T_{out}$ generated by the buffer circuit 820. The computing circuit 810 calculates a sum of $T_{out}$ and $A_0$ to $A_{N-1}$, scales down the quantity of the pieces of first bitstream data, and finally outputs a computing result and $T_{in}$. The buffer circuit 820 stores the buffer input data $T_{in}$ for one cycle, and decides, based on a value of the buffer input data $T_{in}$, to maintain or flip a value of the output $T_{out}$. In one embodiment, when $T_{in}$ is 0, the value of the output $T_{out}$ remains unchanged; when $T_{in}$ is 1, the value of the output $T_{out}$ is flipped. The cycle in this embodiment of the present invention is a cycle in which a plurality of bitstreams $A_0$ to $A_{N-1}$ are input. For example, if 1-bit data of each piece of first bitstream data is input every 2 ns, a cycle is 2 ns. Likewise, after a quantity of input bitstreams of the multi-addend adder circuit 800 and a quantity of output bitstreams of the multi-addend adder circuit 800 are correspondingly changed, the multi-addend adder circuit 720, the multi-addend adder circuit 730, and the like may all implement a function of multi-addend addition.

In one cycle, a quantity of pieces of bitstream data whose values are 1 in the plurality of pieces of input first bitstream data $A_0$ to $A_{N-1}$ is used as summation data m. The buffer input data $T_{in}$ is a least significant bit of m in binary. In other words, m[0] is a result of an XOR operation performed on a plurality of input bitstreams $A_0$ to $A_{N-1}$. For example, when the input bitstreams are four bitstreams: $A_0$, $A_1$, $A_2$, and $A_3$, $M[0]=A_0 \oplus A_1 \oplus A_2 \oplus A_3$. The plurality of pieces of second bitstream data output by the computing circuit 810 are N/2 bitstreams. When N is an odd number, N/2 is rounded up to a next integer. In one embodiment, the plurality of pieces of second bitstream data include $W_1$ pieces of bitstream data whose values are 1, $W_t$ pieces of bitstream data whose values are $T_{out}$, and $W_0$ pieces of bitstream data whose values are 0. $W_1$ is $\lfloor m/2 \rfloor$, that is, a value obtained by rounding down a result of dividing the summation data m by 2. $W_t$ is a remainder of dividing the summation data m by 2, that is, m mod 2. $W_0$ is a difference between a quantity of the pieces of second bitstream data and a sum of $W_1$ and $W_t$, that is, $\lceil N/2 \rceil - W_1 - W_t$. $W_1$, $W_t$, and $W_0$ may all be 0.

A capacity of the buffer circuit 820 needs to be at least 1 bit, to decide, based on $T_{in}$ output by the computing circuit 810, whether to flip the output $T_{out}$ of the buffer circuit 820. The buffer circuit 820 is usually a flip-flop or another sequential circuit that can have a maintaining function and a flipping function based on different values of an input signal.

A specific example is used to describe an operating procedure of the multi-addend adder circuit 800. For example, the inputs are four bitstreams $A_0$ to $A_3$, and the buffer output data $T_{out}$ of the buffer circuit 820 is 0. In a first cycle, the bitstreams $A_0$ to $A_3$ that are input to the computing circuit 810 are 0110. Bitstreams output by the computing circuit 810 are one 1 and one 0. In other words, two bitstreams that are finally output are 10 or 01. Therefore, the multi-addend adder circuit implements conversion from four addends to two addends, namely, conversion from 0+1+1+0 to 0+1 or 1+0.

The buffer circuit 820 stores the buffer input data $T_{in}$ generated by the computing circuit 810 in each cycle, and the buffer input data $T_{in}$ is used for computing in a next cycle. In other words, computing performed by the multi-addend adder circuit 800 in a current cycle is actually computing performed on buffer input data $T_{in}$ generated after computing in a previous cycle and a plurality of input bitstreams $A_0$ to $A_{N-1}$, but not computing performed on only the plurality of bitstreams $A_0$ to $A_{N-1}$ in the current cycle. Therefore, a computing error is reduced, and computing precision of the multi-addend adder circuit 800 is improved.

Figures 9, 10:
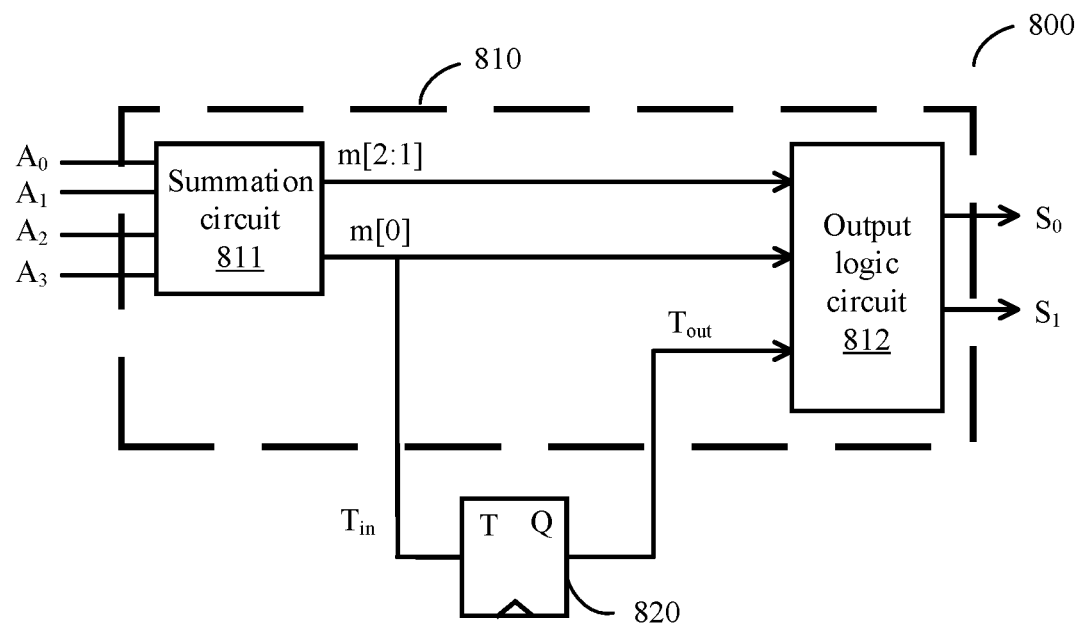
FIG. 9 is a schematic diagram of still another specific multi-addend adder circuit according to an embodiment of the present invention.
FIG. 10 shows an output truth table according to an embodiment of the present invention.

FIG. 9 shows a more specific implementation of the multi-addend adder circuit 800, including a computing circuit 810 and a buffer circuit 820. The computing circuit includes a summation circuit 811 and an output logic circuit 812. The summation circuit 811 has a same function as the summation circuit 312. The summation circuit 811 is configured to: receive a plurality of pieces of first bitstream data $A_0$ to $A_{N-1}$ in a current cycle, calculate summation data m, and output m[N-1:1] to the output logic circuit 812 and output m[0] to the output logic circuit 812 and the buffer circuit 820. m[N-1:1] is a most significant bit to a second least significant bit, namely, an $(N-1)^{th}$ bit to a $1^{st}$ bit that are of the summation data m. m[0] is a least significant bit, namely, a $0^{th}$ bit of the summation data m. The output logic circuit 812 is configured to: receive m[N-1:1] and m[0] that are generated by the summation circuit 811, and buffer output data $T_{out}$ generated by the buffer circuit 820; and generate second bitstreams $S_0$ and $S_1$ through computing.

A specific example is used to describe an operating procedure of the multi-addend adder circuit 800. As shown in FIG. 9, the multi-addend adder circuit 800 converts four input bitstreams $A_0$ to $A_3$ to two bitstreams $S_0$ and $S_1$, to implement a function of $S_0+S_1=\frac{1}{2}(A_0+A_1+A_2+A_3)$. In this case, a scale-down coefficient K=2. The computing circuit 810 includes the summation circuit 811 and the output logic circuit 812. The summation circuit 811 receives a plurality of input bitstreams $A_0$ to $A_3$, calculates a quantity of ones in four bits that are input at a same moment, and uses a binary number m to represent a computing result. The output logic circuit 812 receives results m[2:1] and m[0] that are output by the summation circuit 811 and buffer output data $T_{out}$ of the buffer circuit 820, and outputs bitstreams $S_0$ and $S_1$. The buffer circuit 820 receives buffer input data m[0] generated by the summation circuit 811, and determines the buffer output data $T_{out}$ based on parity of m[0]. When m is an odd number, the buffer output data $T_{out}$ is flipped; when m is an even number, $T_{out}$ remains unchanged. The summation circuit 811 may be a parallel counter or other combinational logic to implement computing of a quantity of ones input to the summation circuit 811. In one embodiment, bits output by the summation circuit 811 may be provided by the following logical expressions: $m[0]=A_0 \oplus A_1 \oplus A_2 \oplus A_3$; $m[2]=A_0 \cdot A_1 \cdot A_2 \cdot A_3$; and $m[1]=\overline{m[2]} \cdot (A_0 \cdot A_1 + A_0 \cdot A_2 + A_0 \cdot A_3 + A_1 \cdot A_2 + A_1 \cdot A_3 + A_2 \cdot A_3)$.

The buffer circuit 820 is a flip-flop, to decide, based on the current buffer input data m[0], whether to flip the buffer output data $T_{out}$.

For different output cases, the output logic circuit 812 may be configured as different combinational logic. An output truth table 1000 shown in FIG. 10 is a possible output case. In this case, m represents a quantity of ones in bitstreams $A_0$ to $A_3$ that are input at a same moment. In other words, m represents summation data. $S_0$ and $S_1$ represent scaled-down addends, namely, a plurality of pieces of output second bitstream data. $T_{out}$ represents buffer output data generated by the buffer circuit 820. When a value of m remains unchanged, values of $S_0$ and $S_1$ in the truth table may be interchanged, to form a different truth table corresponding to a different output case. Therefore, the output case corresponding to the output truth table 1000 is not unique. Different truth tables result in different combinational logic structures of the output logic circuit 812 and further result in different expressions of output results $S_0$ and $S_1$, but do not affect a final computing result of the multi-addend adder circuit 800. For example, output results are $S_0+S_1=0+1$ or $S_0+S_1=1+0$, but both $S_0+S_1=0+1$ and $S_0+S_1=1+0$ represent a same value: 1. Specific logic functions implemented by the output truth table 1000 are $S_0=T_{out} m[0] m[1]+m[2]$ and $S_1=T_{out} m[0]+m[1]+m[2]$. For another possible truth table, the logical expressions for outputting $S_0$ and $S_1$ vary with the truth table.

Output relationships in the output truth table 1000 shown in FIG. 10 are used to describe an operating principle of the multi-addend adder circuit 800 and the specific logic functions implemented by the output logic circuit 812. For example, in input bitstreams $A_0$ to $A_3$, the bitstream $A_0$ is 01 00 (1/4), the bitstream $A_1$ is 01 00 (1/4), the bitstream $A_2$ is 00 10 (1/4), and the bitstream $A_3$ is 00 11 (2/4). A least significant bit of each bitstream is first input to the computing circuit 810. An initial value in the buffer circuit 820 is 0. The least significant bit is first input to the summation circuit 811. In a first cycle, $T_{out}=0$, and input values of the bitstreams $A_0$ to $A_3$ are 0, 0, 0, and 1. Then, summation data m represents 001 in binary, and $m[0]=T_{in}=1$. In this case, according to the output truth table 1000, $S_0=0$ and $S_1=T_{out}=0$. A quantity $W_1$ of bitstreams whose values are 1 is 0, a quantity $W_t$ of bitstreams whose values are $T_{out}$ is 1, and a quantity $W_0$ of bitstreams whose values are 0 is 1. In a second cycle, because $T_{in}$ in the previous cycle is equal to 1, $T_{out}=1$. Values of $A_0$ to $A_3$ are 0, 0, 1, and 1. Then, summation data m represents 010 in binary, and $m[0]=T_{in}=0$. In this case, according to the output truth table 1000, $S_0=0$ and $S_1=1$. A quantity $W_1$ of bitstreams whose values are 1 is 1, a quantity $W_t$ of bitstreams whose values are $T_{out}$ is 0, and a quantity $W_0$ of bitstreams whose values are 0 is 1. In a third cycle, because $T_{in}$ in the previous cycle is 0, $T_{out}=1$. Values of $A_0$ to $A_3$ are 1, 1, 0, and 0. Then, summation data m represents 010 in binary, and $m[0]=T$ n=0. In this case, according to the output truth table 1000, $S_0=0$ and $S_1=1$. A quantity $W_1$ of bitstreams whose values are 1 is 1, a quantity $W_t$ of bitstreams whose values are $T_{out}$ is 0, and a quantity $W_0$ of bitstreams whose values are 0 is 1. In a fourth cycle, because $T_{in}$ in the previous cycle is 0, $T_{out}=1$. Values of $A_0$ to $A_3$ are 0, 0, 0, and 0. Then, summation data m represents 000 in binary, and $m[0]=T_{in}=0$. In this case, according to the output truth table 1000, $S_0=0$ and $S_1=0$. A quantity $W_1$ of bitstreams whose values are 1 is 0, a quantity $W_t$ of bitstreams whose values are $T_{out}$ is 0, and a quantity $W_0$ of bitstreams whose values are 0 is 2.

Then, a bitstream $S_0$ output by the computing circuit 810 is 00 00, and a bitstream $S_1$ output by the computing circuit 810 is 01 10. $S_0+S_1=0+2/4=2/4$. A theoretical computing result is $\frac{1}{2}(A_0+A_1+A_2+A_3)=\frac{5}{8}$. A difference between $S_0+S_1$ and the theoretical computing result is $\frac{1}{8}$. Therefore, computing precision of the multi-addend adder circuit 800 is improved.

Figures 11, 12:
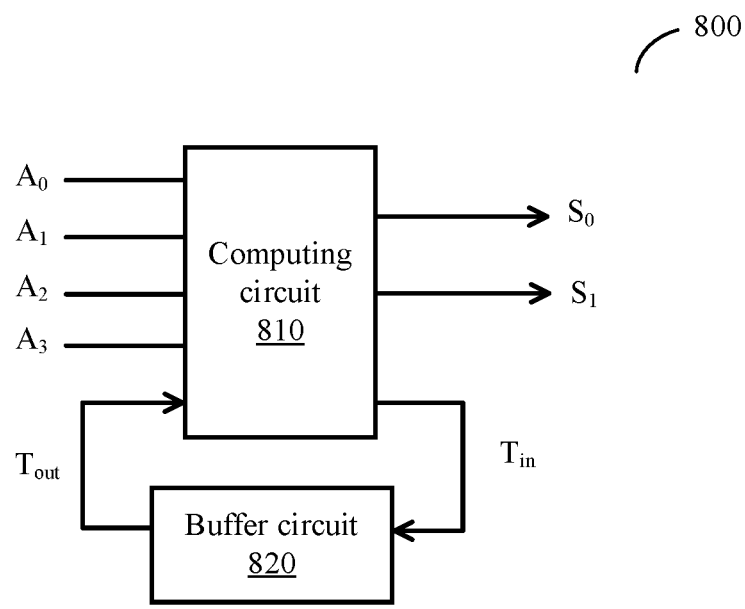
FIG. 11 is a schematic diagram of yet another specific multi-addend adder circuit according to an embodiment of the present invention.
FIG. 12 shows another output truth table according to an embodiment of the present invention.

FIG. 11 shows a more specific implementation of a multi-addend adder circuit 800, including a computing circuit 810 and a buffer circuit 820. An output case corresponding to the multi-addend adder circuit 800 is an output truth table 1200 shown in FIG. 12. In this case, summation data m represents a quantity of ones in bitstreams $A_0$ to $A_3$ that are input at a same moment. In other words, m represents the summation data. $S_0$ and $S_1$ represent scaled-down addends, namely, output bitstreams. $T_{out}$ represents buffer output data generated by the buffer circuit 820. When a value of m remains unchanged, values of $S_0$ and $S_1$ in the truth table may be interchanged, to form a different truth table. Therefore, the output truth table 1200 is only a possible truth table. Compared with $T_{out}$ in the output truth table 1000, $T_{out}$ in the output truth table 1200 can only appear in the bitstream $S_1$ and but not in the bitstream $S_0$. Therefore, a logic circuit structure that is of the computing circuit 810 and that corresponds to the output truth table 1200 is simpler. Specific logic functions implemented by the output truth table 1200 are as follows:

$$S_0 = A_0 \cdot A_1 \cdot A_2 + A_0 \cdot A_1 \cdot A_3 + A_0 \cdot A_2 \cdot A_3 + A_1 \cdot A_2 \cdot A_3 \text{ and}$$

$$S_1 = T_{in}T_{out} + \overline{T_{in}}(A_0+A_1+A_2+A_3).$$

It should be noted that, in the embodiments of the present invention, the multi-addend adder circuits 800 that use a same reference sign have a same function, but may have different internal circuit structures. For example, both the multi-addend adder circuit 800 in FIG. 8 and the multi-addend adder circuit 800 in FIG. 11 may add up a plurality of input first bitstreams, halve a quantity of the bitstreams, and output bitstreams. However, quantities of the input bitstreams are different, and corresponding output truth tables are different. Therefore, internal structures of the multi-addend adder circuits 800 are not completely the same.

The apparatuses and methods disclosed in the foregoing embodiments may be implemented in other manners. For example, the described embodiments are merely examples. For example, division into the different circuits is merely logical function division and may be other division in actual implementation. For example, a plurality of circuits or circuits may be combined or integrated into another system. In addition, the mutual coupling relationship or communication connection relationship between the circuits discussed in the foregoing embodiments may be implemented through some interfaces. The mutual couplings or communication connections between the apparatuses or circuits may be implemented in an electrical manner or in another manner.

Functional circuits in the embodiments of the present invention may be integrated into one processing circuit, or may be separate circuits. The foregoing integrated circuit may be implemented in a form of hardware, or may be implemented in a form of software.

When the integrated circuit is implemented in a form of a software functional circuit and sold or used as an independent product, the integrated circuit may be stored in a computer-readable storage medium. Based on such an understanding, the technical solutions of the present invention essentially, or the part contributing to the prior art, or all or some of the technical solutions may be implemented in a form of a software product. The computer software product is stored in a storage medium and includes several instructions for instructing a computer device (which may be a personal computer, a server, a network device, or the like) to perform all or some of the steps of the methods described in the embodiments of the present invention. The foregoing storage medium includes any medium that can store program code, such as a universal serial bus (USB) flash drive, a read-only memory (ROM), a random access memory (RAM), a removable hard disk, a magnetic disk, or an optical disc.

What is claimed is:

1. A multi-addend adder circuit, comprising:
   a computing circuit;
   a buffer circuit, configured to: store buffer input data for at least one cycle, and input the buffer input data as buffer output data to the computing circuit; and
   the computing circuit, configured to: perform computing on a plurality of pieces of first bitstream data and the buffer output data that are input to the computing circuit, and output second bitstream data and the buffer input data, wherein
   the buffer input data is a remainder of dividing a sum of summation data in all cycles until a current cycle by a scale-down coefficient, the summation data in each cycle is a quantity of pieces of first bitstream data whose values are 1 in the plurality of pieces of first bitstream data in the cycle, the second bitstream data is a quotient of dividing a sum of the summation data in each cycle and the buffer output data in each cycle by the scale-down coefficient, the plurality of pieces of first bitstream data and the second bitstream data are data in a polar representation, the scale-down coefficient is a preset parameter, and the cycle is one in which the plurality of pieces of first bitstream data are input.

2. The multi-addend adder circuit of claim 1, wherein the computing circuit comprises:
   a summation circuit configured to receive the plurality of pieces of first bitstream data and generate first intermediate data, and the first intermediate data is the summation data.

3. The multi-addend adder circuit of claim 2, wherein the computing circuit further comprises:
   an adder circuit configured to receive the first intermediate data generated by the summation circuit and the buffer output data generated by the buffer circuit and generate second intermediate data, and the second intermediate data is a sum of the first intermediate data and the buffer output data.

4. The multi-addend adder circuit of claim 3, wherein the computing circuit further comprises:
   a comparator circuit, configured to: receive the second intermediate data generated by the adder circuit, compare the second intermediate data with the scale-down coefficient, and generate the second bitstream data, wherein
   when the second intermediate data is greater than or equal to the scale-down coefficient, the second bitstream data is 1; and
   when the second intermediate data is less than the scale-down coefficient, the second bitstream data is 0.

5. The multi-addend adder circuit of claim 4, wherein when the scale-down coefficient is 2 to the power of an integer, the second bitstream data generated by the comparator circuit is a most significant bit of the second intermediate data, wherein the second intermediate data is binary data.

6. The multi-addend adder circuit of claim 2, wherein the summation circuit is a parallel counter.

7. The multi-addend adder circuit of claim 1, wherein the computing circuit further comprises:
   a subtractor circuit configured to receive the second intermediate data generated by the adder circuit and the second bitstream data generated by the comparator circuit and generate the buffer input data, wherein
   when the second bitstream data is 1, the buffer input data is a difference between the second intermediate data and the scale-down coefficient; and
   when the second bitstream data is 0, the buffer input data is equal to the second intermediate data.

8. The multi-addend adder circuit of claim 7, wherein when the scale-down coefficient is 2 to the power of an integer, buffer input data that is in the current cycle and that is generated by the subtractor circuit is a second most significant bit to a least significant bit of the second intermediate data, wherein the second intermediate data is binary data.

9. The multi-addend adder circuit of claim 1, wherein a quantity of bits of a capacity of the buffer circuit is at least a logarithm of the scale-down coefficient to base 2.

10. A multi-addend adder circuit, comprising:
    a summation circuit, wherein a plurality of input ends of the summation circuit are respectively configured to receive a plurality of pieces of first bitstream data;
    an adder circuit, wherein a first input end of the adder circuit is coupled to an output end of the summation circuit, and a second input end of the adder circuit is coupled to an output end of a buffer circuit;
    a comparator circuit, wherein an input end of the comparator circuit is coupled to an output end of the adder circuit, and an output end of the comparator circuit is configured to output a adding result of the plurality of pieces of first bitstream data;
    a subtractor circuit, wherein a first input end of the subtractor circuit is coupled to the output end of the adder circuit, a second input end of the subtractor circuit is coupled to the output end of the comparator, and a output end of the subtractor circuit is coupled to the input end of the buffer circuit.

11. The multi-addend adder circuit of claim 10, wherein the multi-addend adder circuit further comprises:
    the buffer circuit, wherein the input end of the buffer circuit is coupled to the output end of the subtractor circuit, and the output end of the buffer circuit is coupled to the input end of the adder circuit.

12. The multi-addend adder circuit of claim 10, wherein the summation circuit is configured to: receive the plurality of pieces of first bitstream data, calculate a quantity of pieces of first bitstream data whose values are 1 in the plurality of pieces of first bitstream data in each cycle, and generate first intermediate data;
    the adder circuit is configured to: add the first intermediate data and third intermediate data and generates second intermediate data, wherein the third intermediate data is an output of the subtractor circuit;
    the comparator circuit is configured to: receive the second intermediate data and generating second bitstream data, wherein
    when the second intermediate data is greater than or equal to a scale-down coefficient, the second bitstream data is 1; and
    when the second intermediate data is less than the scale-down coefficient, the second bitstream data is 0, the plurality of pieces of first bitstream data and the second bitstream data are data in a polar representation, and the scale-down coefficient is a preset parameter;
    the subtractor circuit is configured to: receive the second intermediate data and the second bitstream data and generate the third intermediate data, wherein
    when the second bitstream data is 1, the third intermediate data is a difference between the second intermediate data and the scale-down coefficient; and
    when the second bitstream data is 0, the third intermediate data is the second intermediate data; and the buffer circuit is configured to store buffer data for at least one cycle and output the buffer data; and the cycle is one in which the plurality of pieces of first bitstream data are input.

13. The multi-addend adder circuit of claim 12, wherein when the scale-down coefficient is 2 to the power of an integer, the second bitstream data generated by the comparator circuit is a most significant bit of the second intermediate data, wherein the second intermediate data is binary data.

14. The multi-addend adder circuit of claim 12, wherein when the scale-down coefficient is 2 to the power of the integer, the third intermediate data generated by the subtractor circuit is a second most significant bit to a least significant bit of the second intermediate data, wherein the second intermediate data is binary data.

15. The multi-addend adder circuit of claim 10, wherein the multi-addend adder circuit further comprises:
the buffer circuit, wherein the input end of the buffer circuit is coupled to the output end of the adder circuit, and the output end of the buffer circuit is respectively coupled to an input end of the comparator circuit and an input end of the subtractor circuit.

16. The multi-addend adder circuit of claim 10, wherein the summation circuit is a parallel counter.

17. A multi-addend adder circuit, comprising:
a buffer circuit, configured to: store buffer input data for one cycle and generate buffer output data, wherein
  when the buffer input data is 0, a value of the buffer output data remains unchanged; and
  when the buffer input data is 1, a value of the buffer output data is flipped; and
a computing circuit, configured to: perform computing on a plurality of pieces of first bitstream data and the buffer output data that are input to the computing circuit, and output a plurality of pieces of second bitstream data and the buffer input data; wherein
the buffer input data is a value obtained by performing an XOR operation on the plurality of pieces of first bitstream data, a quantity of the plurality of pieces of second bitstream data is a value obtained by rounding up a result of dividing a quantity of the plurality of pieces of first bitstream data by 2, and the plurality of pieces of second bitstream data comprise $W_1$ pieces of bitstream data whose values are 1, $W_t$ pieces of bitstream data that has a same value as the buffer output data, and $W_0$ pieces of bitstream data whose values are 0; wherein $W_1$ is a value obtained by rounding down a result of dividing summation data by 2, $W_t$ is a remainder of dividing the summation data by 2, and $W_0$ is a difference between the quantity of the plurality of pieces of second bitstream data and a sum of $W_1$ and $W_t$, wherein the summation data in each cycle is a quantity of pieces of the first bitstream data whose values are 1 in the plurality of pieces of the first bitstream data in the cycle; and the plurality of pieces of first bitstream data and the plurality of pieces of second bitstream data are data in a polar representation, and the cycle is a cycle in which the plurality of pieces of first bitstream data are input.

18. The multi-addend adder circuit of claim 17, wherein the buffer circuit is a flip-flop.

19. The multi-addend adder circuit of claim 17, wherein the computing circuit comprises a summation circuit and an output logic circuit, wherein
the summation circuit is configured to: receive the plurality of pieces of first bitstream data in a current cycle, calculate the summation data, and generate first intermediate data and second intermediate data, wherein the first intermediate data is a least significant bit of the summation data, the second intermediate data is a most significant bit to a second least significant bit of the summation data, and the summation data is binary data; and
the output logic circuit is configured to: receive the first intermediate data and the second intermediate data that are generated by the summation circuit, and the buffer output data, and generate the plurality of pieces of second bitstream data.

20. The multi-addend adder circuit of claim 19, wherein the summation circuit is a parallel counter.

* * * * *